United States Patent
Sizikov et al.

(10) Patent No.: US 10,534,023 B1
(45) Date of Patent: Jan. 14, 2020

(54) DATA CENTER ENERGY MONITORING

(71) Applicant: Google Inc., Mountain View, CA (US)

(72) Inventors: Gregory Sizikov, Cupertino, CA (US); Cornelius B. O'Sullivan, Mountain View, CA (US)

(73) Assignee: Google LLC, Mountain View, CA (US)

( * ) Notice: Subject to any disclaimer, the term of this patent is extended or adjusted under 35 U.S.C. 154(b) by 578 days.

(21) Appl. No.: 14/456,465

(22) Filed: Aug. 11, 2014

(51) Int. Cl.
*G01R 21/133* (2006.01)
*G01R 21/06* (2006.01)

(52) U.S. Cl.
CPC .......... *G01R 21/133* (2013.01); *G01R 21/06* (2013.01)

(58) Field of Classification Search
CPC ...... H04L 67/025; G01R 21/133; G01R 21/06
See application file for complete search history.

(56) References Cited

U.S. PATENT DOCUMENTS

| | | | |
|---|---|---|---|
| 5,027,297 A | 6/1991 | Garitty | |
| 5,590,179 A | 12/1996 | Shincovich | |
| 7,200,507 B2 | 4/2007 | Chen | |
| 8,175,834 B2 | 5/2012 | Finkler | |
| 8,495,393 B2 | 7/2013 | Oh | |
| 2003/0091110 A1* | 5/2003 | Diaz | H04B 17/26 375/222 |
| 2006/0066457 A1* | 3/2006 | Mueller | H04Q 9/00 340/870.02 |
| 2007/0236359 A1* | 10/2007 | Wynans | G01D 4/004 340/664 |
| 2008/0036447 A1* | 2/2008 | Slater | G01K 13/00 324/105 |
| 2008/0170469 A1* | 7/2008 | Phillips | G01V 1/26 367/76 |
| 2011/0291671 A1 | 12/2011 | Yang | |
| 2012/0278723 A1* | 11/2012 | Knaggs | H04L 67/025 715/738 |
| 2012/0331322 A1* | 12/2012 | Suzuki | G03G 15/5004 713/323 |
| 2016/0041579 A1* | 2/2016 | Ali | G06F 1/08 713/400 |

FOREIGN PATENT DOCUMENTS

WO WO2004099723 A1 11/2004

* cited by examiner

*Primary Examiner* — Kyle R Quigley
(74) *Attorney, Agent, or Firm* — Fish & Richardson P.C.

(57) ABSTRACT

Methods, systems, and apparatus, including computer programs encoded on a computer storage medium, for monitoring energy consumption. In one aspect, a method includes sending, to a power monitor of a circuit board, requests for power consumption data. The requests are sent periodically based on a reference clock that is located external to the circuit board and that is more accurate than a clock of the power monitor. Each request is for an accumulated amount of power for components of the circuit board. In response to each request, power consumption data is received from the power monitor. The power consumption data specifies the accumulated amount of power for the components of the circuit board since a previous request sent to the circuit board. An amount of energy consumed by the components of the circuit board over a time period is determined based on the received power measurements and the time period.

23 Claims, 3 Drawing Sheets

DATA CENTER ENERGY MONITORING

BACKGROUND

The amount of energy consumed by a load can be determined based on instantaneous power measurements for the load and the amount of time during which the power measurements were generated. Energy monitoring can be used to track the energy efficiency of components and/or facilities. For example, power usage effectiveness (PUE) is based on the energy efficiency of a computer data center that houses computer equipment. The PUE for a data center can be based on a ratio between the total amount of energy used by the data center and the amount of energy used by the computing components housed by the data center.

SUMMARY

This specification describes technologies relating to monitoring the amount of energy consumed by loads housed in a data center.

In general, one innovative aspect of the subject matter described in this specification can be embodied in methods that include the actions of sending, to a power monitor of a circuit board, requests for power consumption data, the requests being sent periodically based on a reference clock that is located external to the circuit board and that is more accurate than a clock of the power monitor, each request being for an accumulated amount of power for components of the circuit board, the accumulated amount of power being based on one or more instantaneous power measurements generated for the components of the circuit board since a previous request was sent to the power monitor; receiving, in response to each request and from the power monitor, power consumption data specifying the accumulated amount of power for the components of the circuit board since a previous request sent to the circuit board; determining an amount of energy consumed by the components of the circuit board over a time period based on the received power measurements and the time period; and providing data that specifies the determined amount of energy. Other embodiments of this aspect include corresponding systems, apparatus, and computer programs, configured to perform the actions of the methods, encoded on computer storage devices.

These and other embodiments can each optionally include one or more of the following features. In some aspects, determining the amount of energy consumed by the components of the circuit board can include determining an average amount of power consumed by the components of the circuit board during the time period and multiplying the average amount of power consumed by the components of the circuit board by an amount of time of the time period.

In some aspects, an amount of time between each pair of requests is determined based on the reference clock. The reference clock can include a crystal oscillator.

In some aspects, the power monitor generates the instantaneous power measurements periodically based on the clock of the power monitor. The power monitor can determine the accumulated amount of power for the components of the circuit board based on a sum of the power measurements generated since the previous request.

Aspects can include sending requests for power consumption data to power monitors of multiple circuit boards and determining an amount of energy consumed by components of each of the multiple circuit boards based on power consumption data received from the multiple circuit boards.

Aspects can include determining an average amount of power consumed by the components over the time period based on power consumption data received for the circuit board and an amount of time of the time period.

In some aspects, multiple requests are sent during the time period and the amount of energy is based on power consumption data for each of the multiple requests. In some aspects, the accumulated amount of power for a particular request specifies a sum of power measurements generated between the previous request and the particular request. In some aspects, the accumulated power for a particular request specifies a running sum of power measurements generated for multiple requests.

In general, another aspect of the subject matter described in this specification can be embodied in methods that include the actions of generating, by a power monitor of a circuit board, power measurements of power consumed by components of the circuit board, the power measurements being generated periodically based on a clock of the circuit board; determining an accumulated amount of power for the components that is based on the power measurements generated for the components during a time period; receiving, from a server that is external to the circuit board, requests for power consumption data specifying the accumulated amount of power, the requests being sent periodically from the server based on a reference clock that is external to the circuit board and that is more accurate than the clock of the circuit board; and in response to receiving each particular request, sending to the server data specifying the accumulated amount of power for the components. Other embodiments of this aspect include corresponding systems, apparatus, and computer programs, configured to perform the actions of the methods, encoded on computer storage devices.

In some aspects, the reference clock can include a crystal oscillator. In some aspects, the server determines an amount of electrical energy consumed by the components based on the power measurements and a monitoring time period. The server can determine the amount of electrical energy consumed by the components by determining an average amount of power consumed by the components during the monitoring time period based on an average power for each request and multiplying the amount of power consumed by the components during the monitoring time period by an amount of time of the monitoring time period. The monitoring time period can be defined by the reference clock.

In some aspects, the accumulated amount of power for a particular time period specifies a sum of power measurements generated during the p[articular time period. In some aspects, the accumulated power for a particular time period specifies a running sum of power measurements generated for multiple time periods.

Particular embodiments of the subject matter described in this specification can be implemented so as to realize one or more of the following advantages. The amount of electrical energy consumed by loads (e.g., direct current (DC) loads) of circuit boards (e.g., computer trays or cards) can be more accurately monitored using an external clock that is more accurate than a clock of the circuit board. An accurate clock that is located external to the circuit board can be used to poll power consumption data from the circuit board such that the size and expense of the circuit board is not significantly increased by installing the clock on the circuit board. A single accurate clock can be used to poll multiple circuit boards (e.g., multiple load trays).

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

The average power and electrical energy consumed by components of rack-mounted cards, trays, or other circuit boards can be determined using an external reference clock. The average power consumed by components of a circuit board during a time period can be determined by averaging the power measurements generated over the time period. For example, the average power can be determined by dividing a sum of power measurements generated during the time period by a number of power measurements generated during the time period. The amount of energy consumed by the components during the time period can then be determined by multiplying the average power for the time period by the amount of time in the time period. The accuracy of both of these calculations depends on the precision of the time period, and therefore the precision of a clock used to define the time period.

A power monitor of a circuit board can be used to generate instantaneous power measurements for components of the circuit board and use the instantaneous measurements to maintain an accumulated amount of power consumed during a particular time period. For example, the accumulated amount of power may be the sum of the instantaneous power measurements generated during the time period. However, the clock of an onboard power monitor may not be as precise as, for example, a crystal oscillator. An external clock, e.g., based on a crystal oscillator, may be used to define a time period for determining the amount of energy consumed by circuit board components during the time period in order to increase the accuracy of energy consumption and average power data. For example, a power monitor of a circuit board may maintain an accumulated amount of power consumed by the circuit board's components between requests received from a host system (e.g., a server). A server may send to the power monitor requests for power consumption data at a particular frequency based on the external clock.

The server can then use power consumption data (e.g., the accumulated amount of power and number of samples used to generate the accumulated amount of power) received from the power monitor to determine the amount of energy consumed and/or the average power used by the circuit board's components. The consumption data for multiple time periods can be used to determine the average power and energy consumption over a monitoring period, for example, that spans multiple request periods. As each request period is substantially the same due to the external reference clock's accuracy, the average power and energy consumption over the monitoring period is more accurate than using a less accurate onboard clock.

Figure 1:
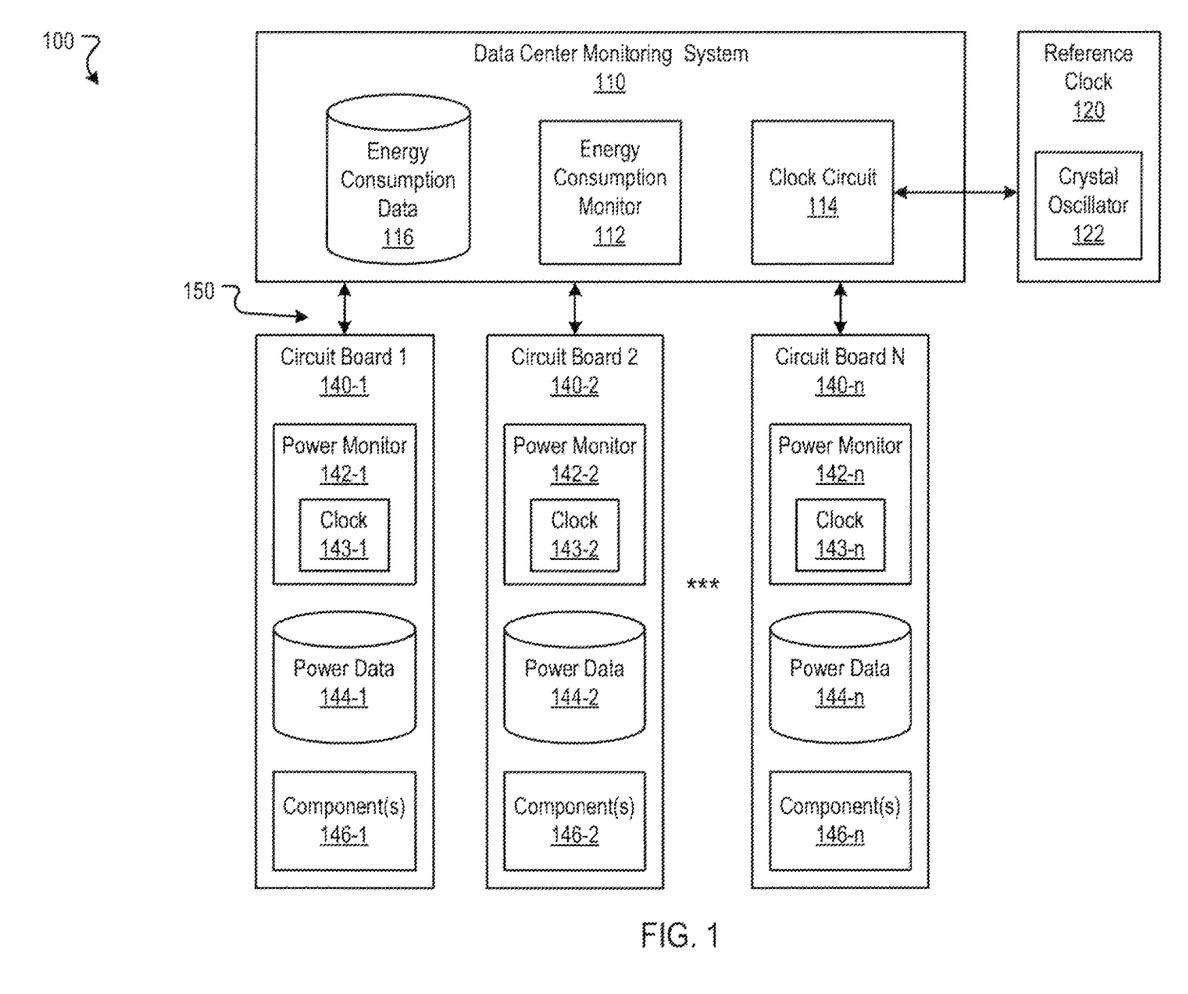
FIG. 1 is a block diagram of an example environment in which a data center monitoring system monitors energy consumed by components of circuit boards.

FIG. 1 is a block diagram of an example environment 100 in which a data center monitoring system 110 monitors energy consumed by components of circuit boards 140-1-140-$n$. The data center monitoring system 110 may be a server located at a data center (or other facility) to monitor the amount of energy and/or the average power consumed by computing resources and other resources (e.g., lighting, HVAC, etc.) of the data center. For example, the data center monitoring system 110 may use energy consumption data to determine the power usage effectiveness (PUE) of the data center, as described in more detail below.

Each circuit board 140-1-140-$n$ can include electrical and/or computer components 146-1-146-$n$ installed thereon or otherwise supported by the circuit board 140-1-140-$n$. For example, each circuit board 140-1-140-$n$ may include one or more processors (e.g., CPUs) servers, memory storage devices, network devices, resistors, capacitors, integrated circuits, state machines, and/or other components. The circuit boards 140-1-140-$n$ can be implemented as, or included in, rack-mounted trays, backplane cards, or other appropriate circuit board configurations.

Each circuit board 140-1-140-$n$ also includes a power monitor 142-1-142-$n$. The power monitors 140-1-140-$n$ may be installed on or otherwise supported by their respective circuit boards. For example, the power monitors 142-1-142-$n$ may be implemented as integrated circuits attached to their respective circuit boards 140-1-140-$n$. Each power monitor 142-1-142-$n$ can generate power measurements (e.g., instantaneous power measurements) that each specifies an amount of power (e.g., direct current (DC) power or alternating current (AC) power) consumed by the components 146-1-146-$n$ of the power monitor's respective circuit board 140-1-140-$n$.

To generate a power measurement, the power monitors 142-1-142-$n$ can obtain voltage and current measurements from a particular point in a circuit that powers the components 146-1-146-$n$ of their respective circuit boards 140-1-140-$n$. For example, each power monitor 142-1-142-$n$ may receive voltage and current measurements taken from an output of a DC power supply that provides power to the components 146-1-146-$n$ of its circuit board 140-1-140-$n$. The power monitors 142-1-142-$n$ can generate an instantaneous power measurement based on an instantaneous voltage measurement and an instantaneous current measurement, for example, taken concurrently. The instantaneous power measurement is equal to a product of the instantaneous voltage measurement and the instantaneous current measurement. Each power monitor 142-1-142-$n$ can store data specifying its generated power measurements in a respective power data store 144-1-144-$n$.

Each circuit board 140-1-140-$n$ also includes a clock 143-1-143-$n$. In some implementations, the clocks 143-1-143-$n$ are onboard clocks of the power monitors 142-1-142-$n$. The power monitors 142-1-142-$n$ can use the clocks 143-1 to 143-$n$ to time the generation of power measurements. For example, the power monitors 142-1-142-$n$ may be configured to generate power measurements on a periodic basis and use the clocks 143-1-143-$n$ to determine when to generate the power measurements. In some implementations, the frequency at which power measurements are generated is user configurable. For example, a user may select to have the power measurements generated every 100 milliseconds, 1000 milliseconds, or based on another appropriate time period.

The power monitors 142-1-142-n can also determine an accumulated amount of power for the components of its circuit board 140-1-140-n based on the power measurements. The accumulated amount of power represents, or is based on, a sum of power measurements generated, for example, during a particular time period. For example, the power monitor 142-1 can determine an accumulated amount of power for the components 146-1 over a time period by summing the power measurements generated during the time period. The power monitors 142-1-142-n can also maintain the number of power measurements generated during the time period, for example, in their respective power data stores 144-1-144-n. In a particular example, the power monitor 142-1 may generate three power measurements of 4 watts, 5 watts, and 6 watts. In this example, the accumulated amount of power is 15 watts and the number of power measurements is 3.

Although each circuit board 140-1-140-n is illustrated as having one power monitor 142-1-142-n, a circuit board may include multiple power monitors. For example, a circuit board may include multiple power circuits, e.g., each having a respective DC power supply, and a power monitor for each power circuit. In another example, a circuit board may include a single power monitor that monitors power consumed by all (or at least a portion) of the components of the circuit board.

The data center monitoring system 110 includes an energy consumption monitor 112, a clock circuit 114, and an energy consumption data store 116. The energy consumption monitor 112 can monitor the amount of energy and/or the average amount of power consumed by the components 146-1-146-n of each circuit board 140-1-140-n. For example, the energy consumption monitor 112 can determine the amount of energy and/or the average amount of power consumed by the components 146-1-146-n of each circuit board 140-1-140-n during one or more time periods based on power consumption data received from the power monitors 142-1-142-n. The energy consumption monitor 112 can request and receive power consumption data from each power monitor 142-1-142-n by way of a data bus 150 (e.g., a serial bus) or by way of a network.

The energy consumption monitor 112 can periodically request power consumption data from each power monitor 142-1-142-n. The power consumption data received from a power monitor 142-1-142-n may specify an accumulated amount of power for components 146-1-146-n of its respective circuit board 140-1-140-n during a particular time period and a number of power measurements generated during the time period and used to determine the accumulated amount of power. For example, the power consumption data received from a power monitor 142-1-142-n may specify an accumulated amount of power for components 146-1-146-n of its respective circuit board 140-1-140-n based on power measurements generated subsequent to a previous request for power consumption data. In this example, each power monitor 142-1-142-n may track the accumulated amount of power for its components 146-1-146-n between each pair of requests based on power measurements generated between the requests and send power consumption data that specifies the accumulated amount of power to the energy consumption monitor 112 in response to a received request.

In another example, the power monitors 142-1-142-n may maintain a running accumulated amount of power, for example, over multiple time periods and/or multiple requests for power consumption data. In a particular example, the accumulated amount of power at the time of a request may be 100 watts (e.g., the sum of ten power measurements of 10 watts each). In response to the request, the power monitor 142-1-142-n may provide power consumption data that specifies 100 watts and ten power measurements. At the time of a subsequent request, the accumulated amount of power may specify 200 watts based on the previous 100 watts and another ten power measurements of 10 watts each. The power monitor 142-1-142-n may subtract the previous amount of accumulated power (e.g., 100 watts) from the current accumulated amount of power and provide power consumption data that specify the result (i.e., 100 watts) and the number of power measurements (i.e., 10). In another example, the energy consumption monitor 112 may subtract the previous accumulated amount of power from the accumulated amount of power specified in the power consumption data to determine the accumulated amount of power for the current time period.

In some implementations, the power consumption data sent by the power monitors 142-1-142-n specify individual power measurements generated during a time period. For example, the power monitors 142-1-142-n may store power measurements generated during time period and provide the power measurements as power consumption data. The energy consumption monitor 112 can then use the individual power measurements to determine the average power during the time period (e.g., by averaging the individual power measurements) and the amount of energy consumed during the time period (e.g., by multiplying the average power by the amount of time in the time period).

The energy consumption monitor 112 can send requests to the power monitors 142-1-142-n based on a predefined or specified time period. For example, the energy consumption monitor 112 may send a request to each power monitor 142-1-142-n once per second, once per minute, or based on another appropriate time period, e.g., a user specified time period. The energy consumption monitor 112 may use the clock circuit 114 to determine when to send a request to a power monitor 142-1-142-n. The clock circuit 114 may include a phase-locked loop circuit 115 that causes the energy consumption monitor 112 to submit requests based on a reference clock 120. For example, the phase-locked loop circuit may cause the energy consumption monitor to send a request in phase with the reference clock 120.

The reference clock 120 can be external to the data center monitoring system 110 and/or external to the circuit boards 140-1-140-n. That is, in some implementations, the reference clock 120 is not installed on one of the circuit boards 140-1-140-n for which power consumption is being monitored. For example, the reference clock 120 may be installed at a different location in a data center that houses the circuit boards and/or somewhere external to the data center.

The example reference clock 120 includes a crystal oscillator 122. The crystal oscillator 122 can include an oscillator circuit that generates an electrical signal at a precise frequency. The reference clock 120 can provide the signal to the clock circuit 114 for use in the phase-locked loop circuit 115. By having a reference clock 120 that includes a crystal oscillator 122 that is external to the circuit boards 140-1-140-n allows the circuit boards 140-1-140-n to be less expensive and smaller than they would be if they each included a reference clock with a crystal oscillator. In addition, a single reference clock 120 can be used to time requests for multiple circuit boards 140-1-140-n.

The data center monitoring system 110 can store power consumption data and/or energy consumption data in the energy consumption data store 116. For example, the data monitoring system 110 can store power consumption data and/or energy consumption data for each circuit board 140-1-140-*n* in the energy consumption data store 116. For each circuit board 140-1-140-*n*, the energy consumption data store 116 may include the amount of power specified by the power consumption data provided in response to each request and a number of power measurements used in determining the amount of power for each request. The energy consumption monitor 112 can use the stored power consumption data to determine the amount of energy and/or the average power consumed by each circuit board 140-1-140-*n* during particular monitoring time periods, as described in more detail below with reference to FIG. 3.

Figure 2:
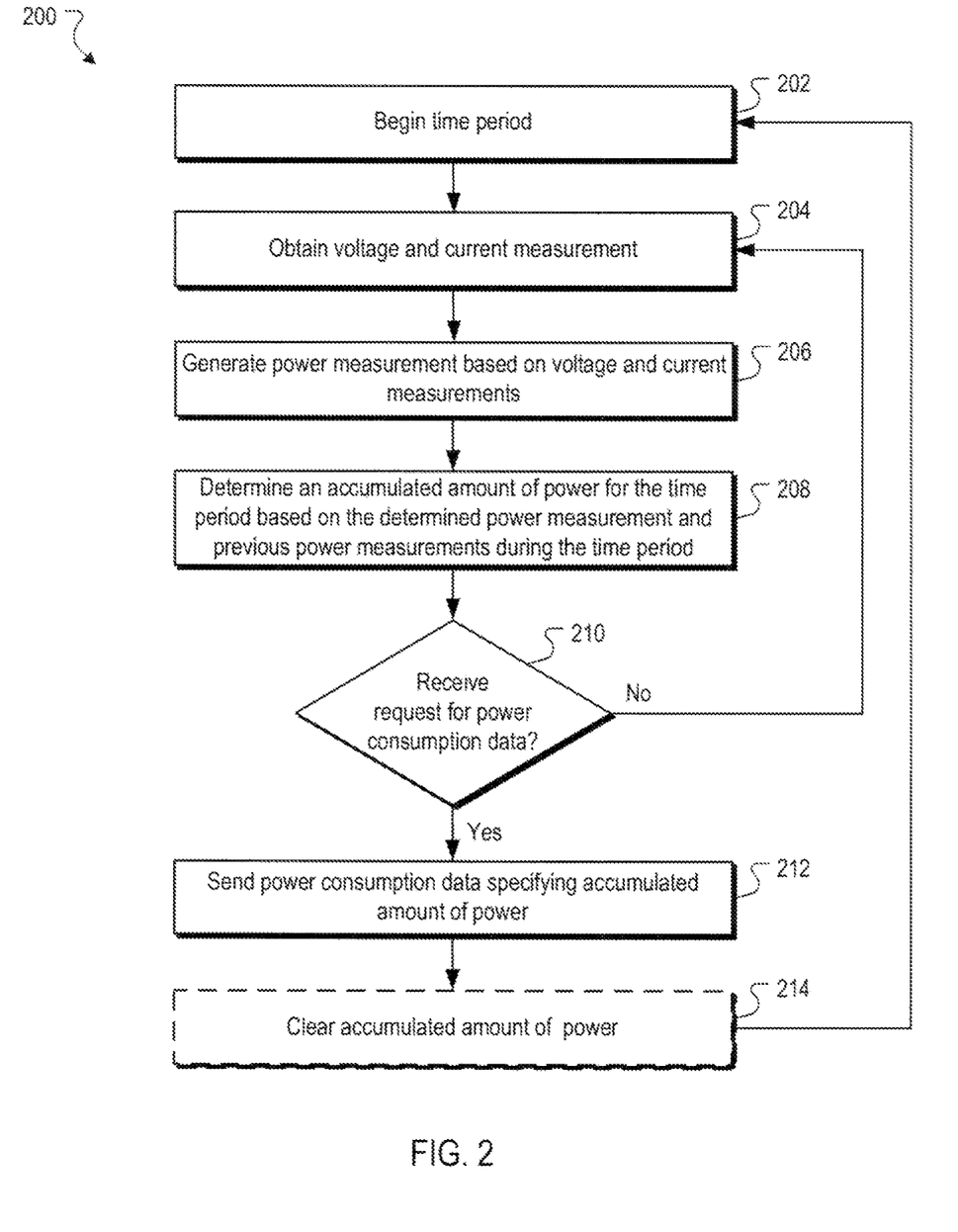
FIG. 2 is a flow diagram of an example process for monitoring an amount of power consumed by components of a circuit board and sending power consumption data specifying the amount of consumed power in response to received requests.

FIG. 2 is a flow diagram of an example process 200 for monitoring an amount of power consumed by components of a circuit board and sending power consumption data specifying the amount of consumed power in response to received requests. Operations of the process 200 can be implemented, for example, by a data processing apparatus, such as a power monitor 142-1-142-*n* of FIG. 1. The process 200 can also be implemented by instructions stored on computer storage medium, where execution of the instructions by a data processing apparatus cause the data processing apparatus to perform the operations of the process 200.

At block 202, a time period for monitoring power consumed by components of a circuit board begins. For example, a power monitor of a circuit board may monitor power consumed during specified time periods. In a particular example, the power monitor may maintain an accumulated amount of power for components of a circuit board between requests for power consumption data received from another device, such as from a data center monitoring system.

At block 204, voltage and current measurements are obtained. For example, a power monitor may obtain voltage and current measurements from a power circuit of the circuit board. The power circuit may provide power from a DC power supply to the components of the circuit board. The power monitor may obtain the voltage and current measurements from a voltage sensor and a current sensor, respectively, that are arranged in the power circuit to measure the total voltage and total current being provided to the one or more components. For example, the voltage sensor and the current sensor may be located along the output of the DC power supply. The voltage and current measurements may represent instantaneous voltage levels at the output of the DC power supply at the time that the measurements were taken.

At block 206, a power measurement is generated based on the obtained voltage and current measurements. For example, the power monitor may generate the power measurement by determining the product of the voltage measurement and the current measurement. The power monitor may also maintain a number of power measurements generated during the time period.

At block 208, an accumulated amount of power consumed by the components of the circuit board for the time period is determined. For example, the power monitor may determine the accumulated amount of power for the time period based on any previous power measurements obtained during the time period and the most recent power measurement generated in block 206. The power monitor may determine the accumulated amount of power for the time period by summing the power measurements (including the previous and most recent power measurement). For example, the power monitor may maintain a total accumulated amount of power for the time period and add the amount of power specified by new power measurements to the total amount as the power measurements are generated.

At block 210, a determination is made whether a request for power consumption data has been received. For example, the request may be received from a data center monitoring system, such as the data center monitoring system 110 of FIG. 1.

If a request has not been received, the process 200 returns to block 204 to generate another power measurement. For example, power measurements may be generated based on a predefined frequency during each time period. In a particular example, the time period between requests may be one second, while the time period between the generation of power measurements may be 100 milliseconds. In this example, the power monitor may generate power measurements based on the 100 millisecond time period and continue updating the accumulated amount of power for the time period until another request is received.

If a request has been received, power consumption data is provided in response to the request at block 212. For example, in response to receiving the request, the power monitor may send power consumption data that specifies the accumulated amount of power for the time period, e.g., since a previous request was received. The power consumption data may also specify the number of power measurements generated during the time period. Alternatively, or in addition, the power consumption data may specify the individual power measurements generated during the time period.

At block 214, the accumulated amount of power for the time period can optionally be cleared. For example, the power monitor may clear the accumulated amount of power after sending the request and start maintaining the accumulated amount of power for a new time period. The new time period may be defined by the received request and a next received request. For example, the new time period may extend from the time the current request was received until the time at which a next request is received. After clearing the accumulated amount of power, the process returns to block 202 to generate power measurements and determine/maintain the accumulated amount of power for the new time period.

In some implementations, the accumulated amount of power is not cleared in response to each request. Instead, a running accumulated amount of power may be maintained for multiple time periods (e.g., for multiple requests). The accumulated amount of power for a particular time period can be determined by subtracting the accumulated amount of power at the beginning of the time period from the accumulated amount of power at the end of the time period. This can be done by the power monitor before providing the power consumption data or by the energy consumption monitor after receiving the power consumption data. For example, the power monitor may provide a running total for the accumulated amount of power in response to each request and the energy consumption monitor may subtract the previous total from the most recent total to determine the accumulated amount of power for the current time period.

In some implementations, the power monitors and/or the energy consumption monitor may detect overflow conditions for a register that stores the accumulated amount of power. For example, if a more recent value of the accumulated amount of power is less than the previous value of the accumulated amount of power, the register may have overflowed. In this example, the power monitors and/or energy consumption monitor may determine the value for the accumulated amount of power between the previous value and the most recent value based on the maximum value that can be stored by the register. For example, the accumulated amount of power may be the more recent value of the accumulated amount of power plus the difference of the maximum value that can be stored by the register and the previous value of the accumulated amount of power.

Figure 3:
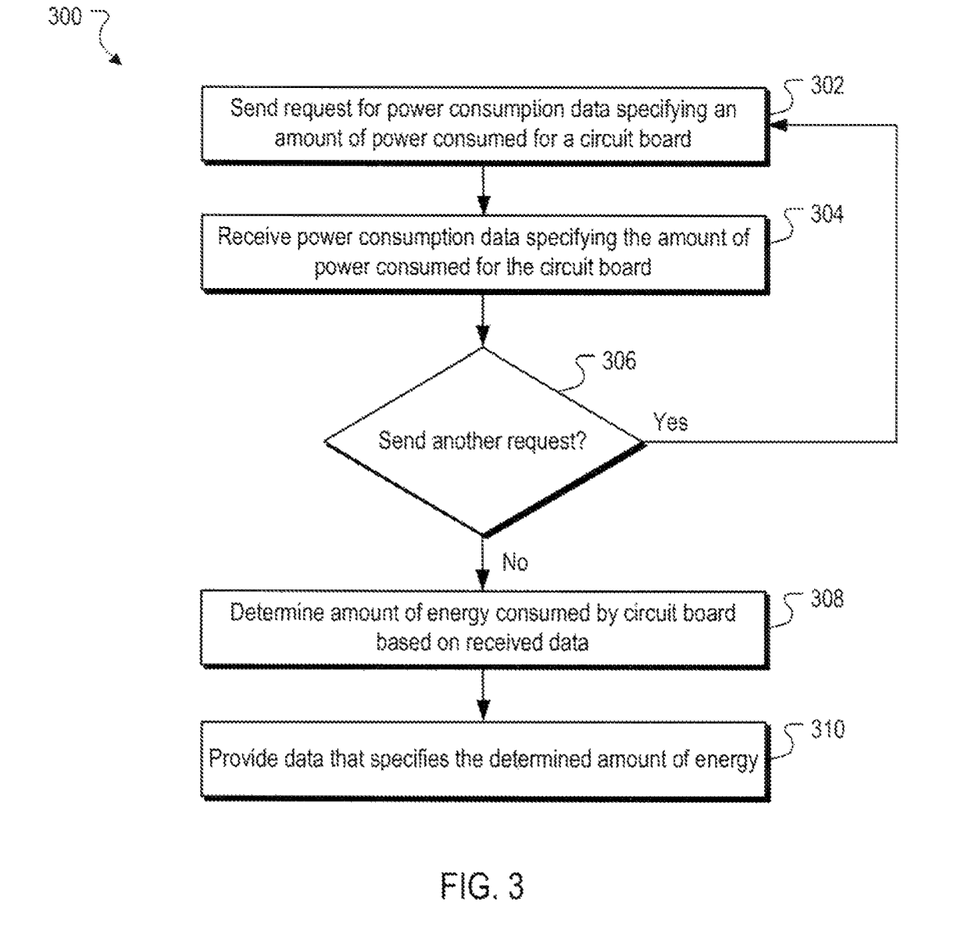
FIG. 3 is a flow diagram of an example process for requesting power consumption data from a circuit board and determining an amount of energy consumed by components of the circuit board based on the received power consumption data.

FIG. 3 is a flow diagram of an example process 300 for requesting power consumption data from a circuit board and determining an amount of energy consumed by components of the circuit board based on the received power consumption data. Operations of the process 300 can be implemented, for example, by a data processing apparatus, such as an energy consumption monitor 112 of a data center monitoring system 110. The process 300 can also be implemented by instructions stored on computer storage medium, where execution of the instructions by a data processing apparatus cause the data processing apparatus to perform the operations of the process 300.

At block 302, a request for power consumption data is sent. For example, a data center monitoring system may send a request for power consumption data to a power monitor of a circuit board. The request may be for power consumption data that specifies an accumulated amount of power for components of the circuit board during a particular time period. For example, the time period may be defined based on requests, as described above.

At block 304, power consumption data is received. The power consumption data may specify the accumulated amount of power for the components of the circuit board for the time period. For example, the accumulated amount of power may be the sum of power measurements generated during the time period. The power consumption data may also specify the number of power measurements generated during the time period. For example, the power consumption data may specify an accumulated amount of power of 1,000 watts and 10 power measurements. This data may be based on 10 measurements of 100 watts each or of other values that sum to the total of 1,000 watts.

At block 306, a determination is made whether to send another request. The requests may be sent to the power monitor based on a specified time period. For example, the requests may be sent every 100 milliseconds, every second, or based on another appropriate time period. The determination of whether to send another request may be based on a reference clock that is external to the circuit board. For example, the reference clock may include a crystal oscillator that is not installed on the circuit to which the requests are being sent. A phased-locked loop of a clock circuit may cause an energy consumption monitor to send the requests in phase with a signal sent by the crystal oscillator.

If a determination is made to send another request, the process 300 returns to block 302 and another request is sent. If a determination is made to not send a request, or if a determination is made to determine an amount of energy consumed and/or average power consumed by the components of the circuit board irrespective of the determination to send a request, an amount of energy consumed (and/or average power consumed) by the components of the circuit board is determined (308).

The average power consumed by the components of the circuit board can be determined based on the received power consumption data. The average power consumed during the time between two requests can be determined by dividing the accumulated amount of power by the number of power measurements used to determine the accumulated amount of power. Continuing the previous example, the average power consumed would be 100 watts (1000 watts/10 measurements).

The average power can also be determined for a monitoring time period that includes multiple request periods. For example, a request may be sent every minute, and the monitoring period may be for a 24 hour period. In this example, the average power for the 24 hour period may be determined by averaging the average powers for each request period. That is, the average power for the 24 hour period may be the average of the average power determined for each one minute period. As the one minute periods are more precise as a result of using the crystal oscillator-based reference clock in place of the onboard clock of the power monitor, the resulting average power for the monitoring time period is more accurate.

The amount of energy consumed by the components of the circuit board can also be determined based on the received power consumption data and a monitoring time period, e.g., that may be the same as or different from the time period used to time the requests. For example, the monitoring time period may be for a length of time that includes a multitude of requests for power consumption data. In a particular example, the power consumption data may be used to determine the energy consumption for the circuit board over the course of a day, week, month, or other appropriate time period, while the requests are sent once per second, minute, etc.

The amount of energy consumed by the components can be based on a product of the average power consumed over the monitoring time period or the integral of the power consumed by the components over the monitoring time period. As the time period for which each portion of power consumption data is monitored and requested is more precise due to the crystal oscillator-based reference clock, the resulting amount of energy consumed is more accurate than using a less precise onboard clock that may experience clock drift as each amount of power consumption is taken over substantially the same amount of time.

The amount of energy consumed can also be used to determine the PUE for a data center that houses the circuit board. For example, an energy consumption monitor can determine a total amount of energy consumed by all of the circuit boards housed by the data center during a monitoring time period based on power consumption data received from the circuit boards during the monitoring time period. The energy consumption monitor can also determine the total amount of energy consumed by the data center during the monitoring time period. To determine the PUE for the data center during the monitoring time period, the energy consumption monitor can divide the total amount of energy consumed by the data center by the total amount of energy consumed by the circuit boards.

At block 310, data specifying the amount of energy consumed and/or the average power is provided. For example, the data may be provided for display to a user. The data may also be provided for use in determining the PUE. For example, the data may be provided to a computer that displays energy and/or power consumption data to a user and/or that determines the PUE for one or more data centers.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A method, comprising:
sending, to a power monitor of a circuit board, requests for power consumption data, the requests being sent periodically based on a specified time period using a reference clock that is located external to the circuit board and that is more precise at keeping time and experiences less drift than a clock of the power monitor that is installed on the circuit board and that is used to generate power consumption measurements at the circuit board, each request being for an accumulated amount of power for components of the circuit board;
receiving, in response to each request and from the power monitor, power consumption data specifying the accumulated amount of power consumed by the components of the circuit board since a previous request sent to the power monitor, wherein the power monitor determines, as the accumulated amount of power, a sum of each instantaneous power measurement generated for the components of the circuit board since the previous request was received by the power monitor, wherein the power monitor generates the instantaneous power measurements periodically based on the clock of the power monitor and based on voltage and current measurements obtained by a voltage sensor and a current sensor of the circuit board, and wherein the power monitor generates two or more instantaneous power measurements between each pair of consecutive requests;
determining an amount of energy consumed by the components of the circuit board over a given time period based on the received power consumption data for the given time period; and
providing data that specifies the determined amount of energy.

2. The method of claim 1, wherein determining the amount of energy consumed by the components of the circuit board comprises:
determining an average amount of power consumed by the components of the circuit board during the given time period; and
multiplying the average amount of power consumed by the components of the circuit board during the given time period by an amount of time of the given time period.

3. The method of claim 1, wherein an amount of time between each pair of requests is determined based on the reference clock.

4. The method of claim 1, wherein the reference clock comprises a crystal oscillator.

5. The method of claim 1, wherein the power monitor determines the accumulated amount of power for the components of the circuit board based on a sum of the power measurements generated since the previous request.

6. The method of claim 1, further comprising:
sending requests for power consumption data to power monitors of multiple circuit boards; and
determining an amount of energy consumed by components of each of the multiple circuit boards based on power consumption data received from the multiple circuit boards.

7. The method of claim 1, further comprising determining an average amount of power consumed by the components over the time period based on power consumption data received for the circuit board and an amount of time of the time period, including:
receiving, for each accumulated amount of power specified by power consumption data received from the circuit board, a quantity of instantaneous power measurements used to determine the accumulated amount of power;
determining, accumulated amount of power specified by power consumption data received from the circuit board during the time period, an average power measurement by dividing the accumulated amount of power specified by the power consumption data by the quantity of instantaneous power measurements used to determine the accumulated amount of power specified by the power consumption data; and
determining an average of the average power measurements.

8. The method of claim 1, wherein multiple requests are sent during the given time period and the amount of energy is based on power consumption data for each of the multiple requests.

9. The method of claim 1, wherein the accumulated amount of power for a particular request specifies a sum of power measurements generated between the previous request and the particular request.

10. The method of claim 1, wherein the accumulated power for a particular request specifies a running sum of power measurements generated for multiple requests.

11. The method of claim 1, wherein:
a data center monitoring system that includes the reference clock sends the requests for power consumption data, receives the power consumption data, and determines the amount of energy consumed by the components of the circuit board over the given time period.

12. The method of claim 11, wherein the power monitor resets the accumulated amount of power to a value of zero after providing the power consumption data to the data center monitoring system in response to each request.

13. The method of claim 11, wherein:
the accumulated power for a particular request specifies a running sum of power measurements generated by the power monitor over a time duration that includes multiple requests from the data center monitoring system; and
the data centering monitoring system determines the accumulated amount of power for a particular time period between the previous request and the request by subtracting a previous accumulated amount of power received for the previous request from the accumulated amount of power received in response to the request.

14. The method of claim 1, further comprising:
receiving, in response to each request and from the power monitor, samples data specifying a quantity of instantaneous power measurements generated during the particular time period between the previous request and the request; and determining an average amount of power consumed during the particular time period between the previous request and the request by dividing the accumulated amount of power by the quantity of instantaneous power measurements.

15. A method performed by one or more data processing apparatus, the method comprising:
generating, by a power monitor of a circuit board, a plurality of instantaneous power measurements of power consumed by components of the circuit board, the power measurements being generated periodically based on a specified time period using a clock of the circuit board and based on voltage and current measurements obtained by a voltage sensor and a current sensor of the circuit board;
determining, as an accumulated amount of power consumed by the components of the circuit board during a time period, a sum of the power measurements generated for the components during the time period, wherein the power monitor generates two or more power measurements during the time period;
receiving, from a server that is external to the circuit board, requests for power consumption data specifying the accumulated amount of power, the requests being sent periodically from the server based on a reference clock that is external to the circuit board and that is more precise at keeping time and that experiences less drift than the clock of the circuit board that is used to generate the instantaneous power consumption measurements; and
in response to receiving each particular request, sending to the server data specifying the accumulated amount of power for the components.

16. The method of claim 15, wherein the reference clock comprises a crystal oscillator.

17. The method of claim 15, wherein the server determines an amount of electrical energy consumed by the components based on the power measurements and a monitoring time period.

18. The method of claim 17, wherein the server determines the amount of electrical energy consumed by the components by:
determining an average amount of power consumed by the components during the monitoring time period based on an average power for each request; and
multiplying the amount of power consumed by the components during the monitoring time period by an amount of time of the monitoring time period, the monitoring time period being defined by the reference clock.

19. The method of claim 15, wherein the accumulated power for a particular time period specifies a running sum of power measurements generated for multiple time periods.

20. A system, comprising:
one or more circuit boards with components installed thereon, each circuit board including a power monitor that:
generates instantaneous power measurements for the components of the circuit board periodically based on a clock of the circuit board and based on voltage and current measurements obtained by a voltage sensor and a current sensor of the circuit board; and
determines, as an accumulated amount of power consumed by the components of the power measurements since a previous request for power consumption data was received by the power monitor, a sum of each instantaneous power measurement generated for the components of the circuit board since a previous request for power consumption data was received by the power monitor, wherein the power monitor generates two or more instantaneous power measurements between each pair of consecutive requests; and
a data center monitoring system that:
periodically requests and receives power consumption data from the power monitor of each circuit board, the power consumption data for each circuit board and for each request specifying an accumulated amount of power consumed by the components installed on the circuit board subsequent to a previous request being received at the circuit board from the data center monitoring system, the requests being sent to each circuit board periodically based on a specified time period using a reference clock that is external to the one or more circuit boards and that is more precise at keeping time and experiences less drift than the clock of each circuit board that is used to generate power consumption measurements;
determines, for each circuit board, an amount of energy consumed by the components installed on each circuit board over a given time period based on the received power consumption data for the given time period; and
provides, for at least one of the circuit boards, data that specifies the determined amount of energy for the at least one circuit board.

21. The system of claim 20, wherein each power monitor determines the accumulated amount of power for the components installed on the circuit board that includes the power monitory by periodically summing the generated power measurements.

22. The system of claim 20, wherein an amount of time between each pair of requests is determined based on the reference clock.

23. The system of claim 20, wherein:
the reference clock comprises a crystal oscillator; and
the data center monitoring system includes a phase-locked loop that causes the data center monitoring system to send the requests at a same phase as a signal received from the crystal oscillator.

* * * * *